United States Patent [19]

Hshieh et al.

[11] Patent Number: 5,585,736
[45] Date of Patent: Dec. 17, 1996

[54] CONTACT PROBE UTILIZING CONDUCTIVE MELTABLE PROBING MATERIAL

[75] Inventors: Fwu-Iuan Hshieh, 20768 Sevilla La., Saratoga, Calif. 95070; Calvin Choi, Pleasanton, Calif.; Yoeh-Se Ho, Sunnyvale, Calif.; Jimmy S. X. Weang, Santa Clara, Calif.

[73] Assignee: Fwu-Iuan Hshieh, Saratoga, Calif.

[21] Appl. No.: 346,037

[22] Filed: Nov. 29, 1994

[51] Int. Cl.⁶ .................................................. G01R 31/02
[52] U.S. Cl. ........................ 324/754; 324/756; 324/757
[58] Field of Search .................................... 324/754, 756, 324/757, 719; 257/248

[56] References Cited

U.S. PATENT DOCUMENTS

| | | | |
|---|---|---|---|
| Re. 32,024 | 11/1985 | Greig | 324/754 |
| 3,794,912 | 2/1974 | Severin | 324/719 |
| 4,021,735 | 5/1977 | Vieweg-Gutberlet et al. | 324/757 |
| 4,409,547 | 10/1983 | Lederman | 324/756 |
| 4,521,730 | 6/1985 | Shulman | 324/754 |
| 5,323,035 | 6/1994 | Leedy | 257/248 |

*Primary Examiner*—Kenneth A. Wieder
*Assistant Examiner*—Kourosh Cyrus Khosravi
*Attorney, Agent, or Firm*—Bo-In Lin

[57] ABSTRACT

A contact probe for semiconductor in-line process monitoring or device measurement is disclosed in this invention which uses gallium, indium or any low-melting and low-vapor pressure electrically conductive alloy as a contact probing material. The probe can be used to directly measure mobile ion density without requiring the formation of aluminum dots on the semiconductor wafers. The safety issues caused by high temperature operation are also eliminated. The time requirement for process-equipment qualification is significantly reduced because the preparation time for aluminum dot formation is now eliminated. In comparison to the mercury probes, since in this invention, the contact is formed at high temperature thus leading to better contacts between the probe and the wafer, which in turn resulting in higher measurement accuracy. Furthermore, the conventional pin slip problem during elevated temperature stress is eliminated by the use of the contact probe of this invention. The device disclosed in this invention includes a metal tube or cylinder surrounded by heating element. A capillary probe connected with a metal or alloy reservoir inside the tube. For conducting the measurement, the conductive material in the reservoir and the capillary probe is melted. The amount of the conductive material in contact with the semiconductor wafer is controlled by the diameter of the capillary and the pressure of the reservoir.

14 Claims, 10 Drawing Sheets

CONTACT PROBE UTILIZING CONDUCTIVE MELTABLE PROBING MATERIAL

BACKGROUND OF THE INVENTION

1. Field of the Invention

This invention relates generally to a contact probe employed for a semiconductor manufacturing in-line monitoring process and for semiconductor device measurement. More particularly, this invention relates to a contact probe suitable for high temperature application and capable of direct thin-film measurement thus reducing preparation and pending time of the fabrication equipments and achieve higher measurement accuracy.

2. Description of the Related Art

In order to control the ion contamination in a semiconductor manufacturing environment, a time-consuming and difficult task of in-line measurement of mobile ions in a semiconductor wafer must be performed to qualify and continuously monitor the fabrication equipments. The performance characteristics of an integrated circuit (IC) device is often adversely affected by the mobile ion contaminations. Contamination of alkali metal ions, e.g., sodium and potassium ions, can affect the threshold voltage of a MOSFET device and degrade the gate oxide rupture voltage and channel mobility. The contamination may also cause device reliability problem due to the fact that under an electrical bias, the contaminants move slowly at room temperature but when the temperature is elevated, the mobile ions are moved at very high speed under the influence of the electrical field as that shown in FIG. 1. Such a moving speed variation at different temperature of the contaminant ions often causes undesirable spurious performance characteristics and leads to reliability problems.

Since the undesirable mobile ions can be generated from a wide variety of sources such as human body, furnace, photo-resist, chemical etchants, etc., the fabrication equipments must first be qualified prior to wafer processing steps are carried out initially. The mobile ion density must also be closely monitored to control the contamination level during the entire fabrication process. Speed and accuracy of mobile ion measuring tools can have significant impact on the productivity and quality of the device manufacture. For those of ordinary skill in the art, there are several in-line measurement and probing techniques being applied for measuring and monitoring the mobile ion contamination.

FIG. 2 shows a capacitance voltage (C-V) in-lin measurement system which is now commonly employed in the industry. The mobile-ion contamination level is determined by measuring the parallel voltage shift ($\Delta V$) between the C-V curve before and after the bias temperature stress. The technique is based on the fact that the mobile ion density ($Q_m$) drifting from the metal-$SiO_2$ interface and the bulk oxide to $SiO_2$—Si interface at a given positive gate bias is proportional to the voltage shift ($\Delta V$), i.e., $Qm=C_{ox}\Delta V$. This measurement technique is very time-consuming since the C-V measurements before and after the stress are to be performed at room temperature while the bias stress measurement is to be carried out at an elevated temperature above 150° C. At least thirty minutes are required to complete this test due to the time wasted in waiting for the temperature to cool down to the room temperature when a conventional C-V measurement is carried out.

FIG. 3 shows another method for mobile ion measurement by the use of a triangular voltage sweep (TVS). A triangular voltage ramp is applied to the gate and an ionic displacement current is measured at an elevated temperature. The contamination level is calculated from gate current due to the mobile ion drift from the oxide bulk to an interface of gate oxide and silicon. The mobile ion density, i.e., $Q_m$, drifting at a given temperature is proportional to the area under the peak in the gate current Ig caused by the ionic motion, i.e., $Q_m=\int I_g dV_g$ where Vg is the gate bias. The TVS method, even that it requires more complicate analyses, can achieve higher speed of operation and is more accurate because unlike the C-V technique which employs two C-V curves to determine the mobile ion density while the TVS method only needs one I-V curve. Furthermore, the TVS measured sample can be maintained at an elevated temperature while taking data without requiring cooling off to room temperature. Additionally, when a TVS method is applied, the mobile ion density can be accurately measured without be affected by the interface trap normally formed at $SiO_2$—Si interface during an oxidation process. In contrast to C-V measurement, the interface trap density varies significantly due to heating which in turn leads to a non-parallel voltage shift thus causing measurement inaccuracies. However, since the measurement technique involves an integration computation as explained above, an on-line computer is required with a computation software together with a data entry device for carrying out the task of ion density measurements. Because different alkali ions have different drift rates, the peak gate current occurs at different gate bias, therefore different mobile ion species such as sodium and potassium, when measured by using the TVS method, can be separated at a given temperature. Both of the above two techniques require that the measurement to be performed at higher temperatures. Furthermore, there are still no contact or contactless probes applying the above two techniques which can measure the mobile ions directly.

FIG. 4 shows a mercury probe which is another contact probe commonly used for in-line process monitor in the industry. A mercury probe has been widely used for epitaxial (EPI) resistivity and oxide fixed charge measurement. Due to the high vapor pressure at higher temperature and the concerns that the mercury vapor may induce health hazards, a mercury probe is not suitable for high temperature mobile ion measurement.

FIG. 5 shows a metal pin probe which is commonly used by first developing aluminum dots on wafers prior to applying a metal pin probe is applied for testing. This requirement of metal dot development not only causes the equipment down time during the formation of these dots which takes at least eight hours, the metal deposition system for dot development may introduce unexpected mobile ions and cause physical damages to the wafer which leads to inaccurate ion level measurements. Another limitation of the metal pin probe is the pin-slip from the dots caused by the thermal expansion of the wafer and the thermal chuck when there is a high temperature induced stress. The pin slip may often cause the inaccuracy in ion contamination measurement.

FIG. 6 shows a four-point probe including four sharp metal pins which is commonly employed for in-line sheet resistance measurement. Such probe does not provide adequate measurement accuracy required especially for shallow junction where the depth is close to the probe damage range, e.g., 0.1 to 0.5 microns. For a shallow junction which is formed by rapid thermal annealing, the four point probe does not provide sufficient accuracy for an in-line operation to monitor the ion-implant dosage.

Besides the above measuring techniques, a contactless probe is not useful for the measurement of mobile ion contamination since the movement of mobile ions requires the presence of an electrical field. For the above reasons, there is still a need in the art of mobile ion measurement, particularly for in-line process monitoring, to provide new and improved measurement techniques and devices to overcome the limitations and difficulties discussed above.

SUMMARY OF THE PRESENT INVENTION

One object of the present invention is to teach a mobile ion measurement technique implemented with new and improved measurement devices whereby the limitations as encountered by the prior art can be overcome.

Another object of the present invention is to teach a mobile ion measurement technique implemented with new and improved measurement devices whereby mobile ions can be directly measured without requiring the formation of aluminum dots on the wafers.

Another object of the present invention is to teach a mobile ion measurement technique implemented with new and improved measurement devices whereby high temperature direct ion measurements can be performed safely without causing any safety concerns.

Another object of the present invention is to teach a mobile ion measurement technique implemented with new and improved measurement devices whereby mobile ions can be directly measured without the measurement inaccuracies caused by probe-pin slips.

Briefly, in a preferred embodiment, the present invention is a contact probe for in-line ion measurement device which employs low-vapor pressure and low-melting-point conductive materials, such as gallium or indium, as the probe contact materials. The melting points of these materials can be below 160° C. while the vapor pressures are generally lower than $10^{-5}$ mm Hg in the temperature range between 100°–300° C. A contact probe employs such probing materials is contained in a metal reservoir inside a metal cylinder surrounded with heating elements. A capillary tube is extendable to the surface of wafer under test which is also in hydraulic communication with the reservoir. In conducting the test, the low-melting-point low-vapor-pressure material in the reservoir is heated by the use of the heating elements surrounding the reservoir. As the temperature is raised and the conductive probing material is melted, it is pressured to flow via the capillary tube to the surface of the wafer. An electrical wire is connected to the metal reservoir as an electrode for current-voltage (I-V) or capacitance-voltage (C-V) measurement.

In another embodiment, the aluminum cylinder which is used as reservoir is replaced with a metal tube. The probing metal in the tube is melted by heat transferred from the hot metal tube through nitrogen or helium. The metal tube is designed to be separated from the reservoir and the capillary to prevent an ionic or metallic contamination from the metal tube. The temperature is then lowered to a room temperature by the use of nitrogen or helium for I-V or C-V measurements after the conductive probing material is in contact with the wafer.

In another embodiment, a four-point probe with separate reservoir are employed for sheet resistance measurement. Gallium with a melting temperature of 30° C. is used as the conductive probing material. Better accuracy can be provided for shallow junction sheet resistance measurement because the elimination of the probe damages as no probe pins are scratching the surface of the shallow junction.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
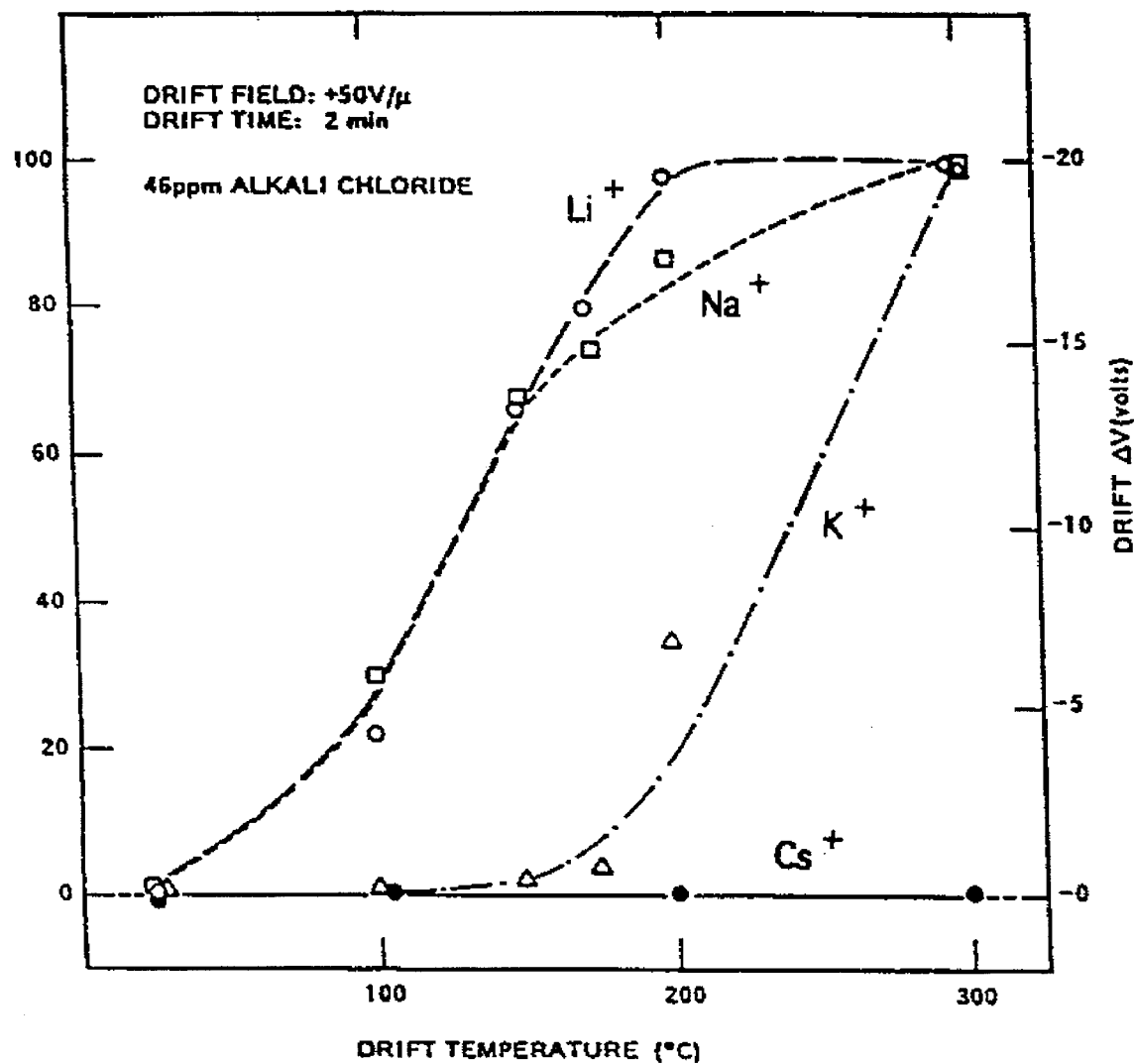
FIG. 1 shows the drift rates of various alkali ions as function of wafer temperature.
Figure 2:
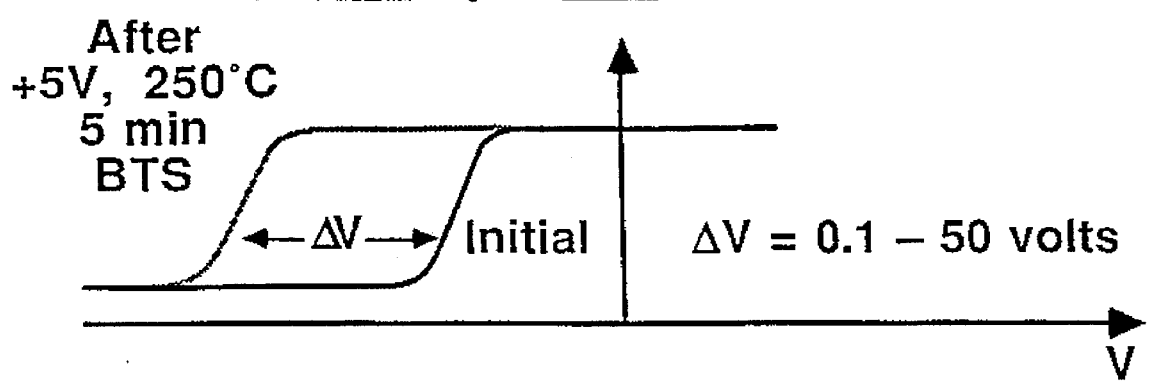
FIG. 2 shows a capacitance-voltage method for mobile ion measurement.
Figure 3:
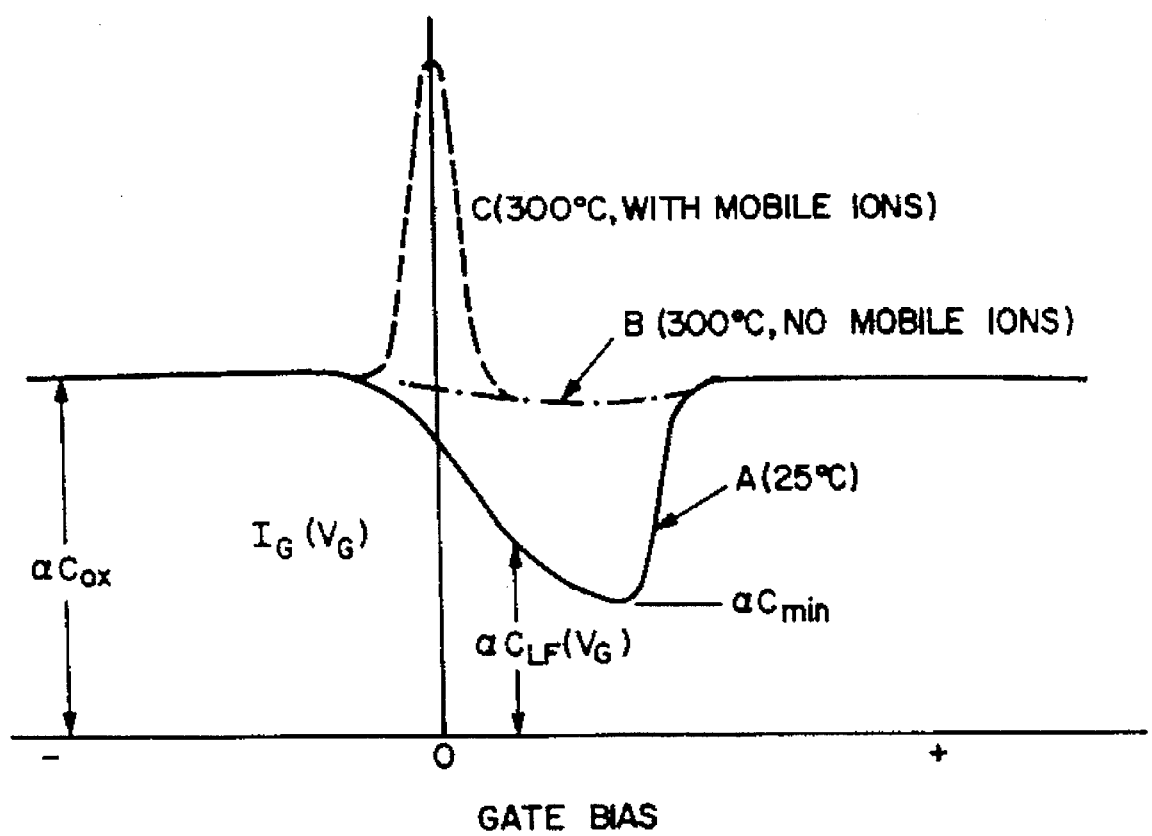
FIG. 3 shows a triangular voltage sweeping (T-V-S) method for mobile ion measurement.
Figure 4:
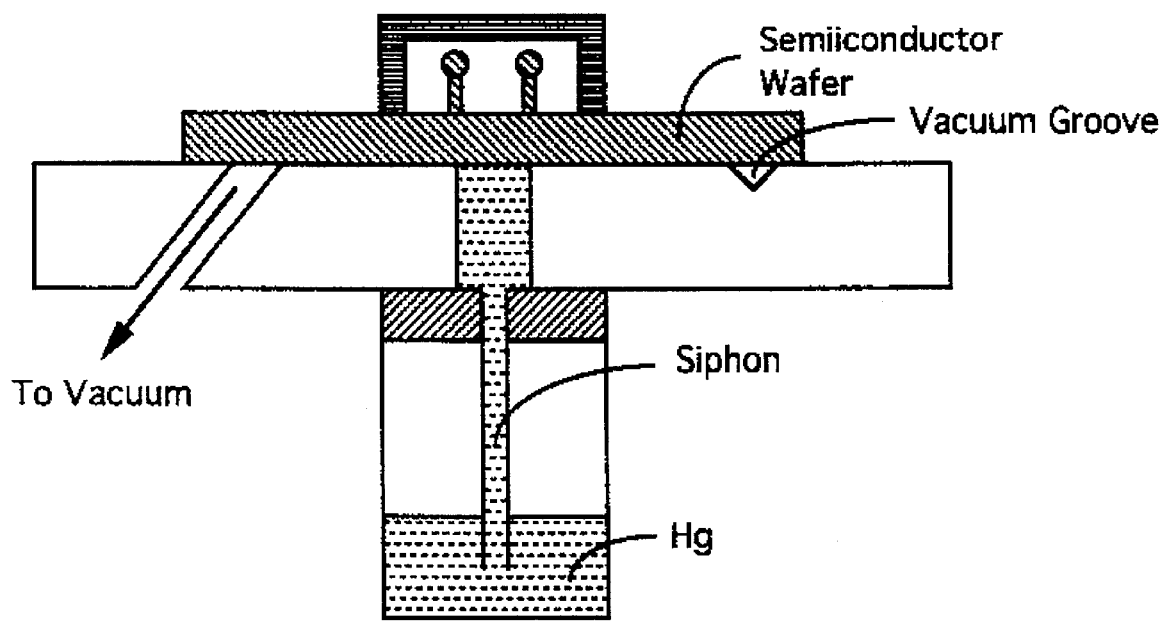
FIG. 4 shows a side cross-sectional view of a conventional mercury probe.
Figure 5:
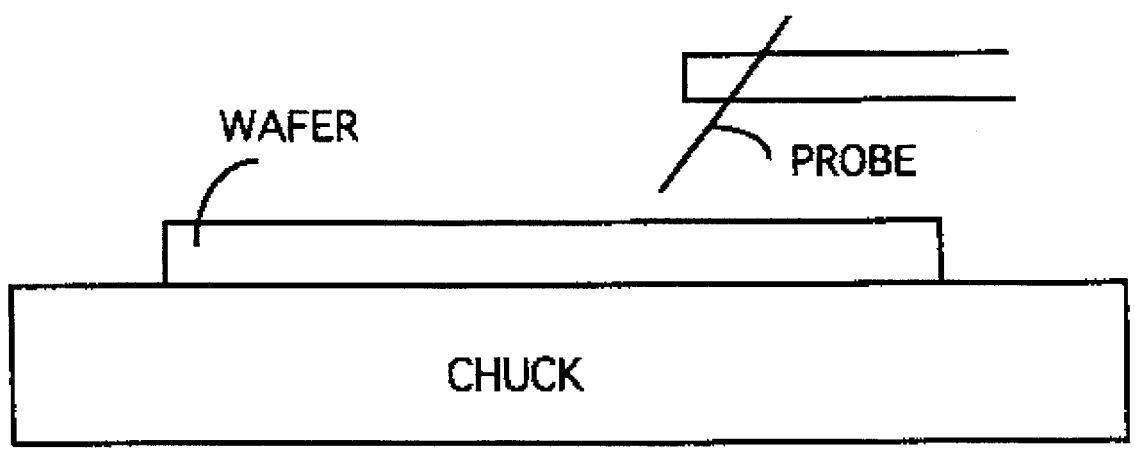
FIG. 5 shows a side cross-sectional view of a single metal pin probe.
Figure 6:
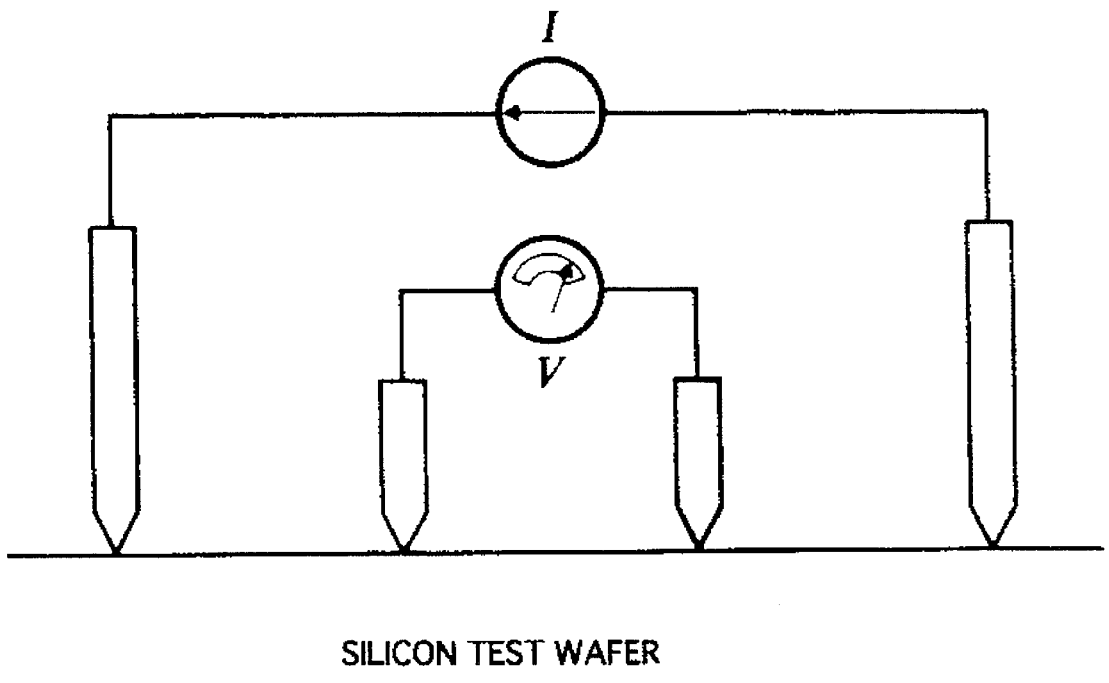
FIG. 6 shows a side cross-sectional view of a four-point probe for measuring sheet resistance.
Figure 7:
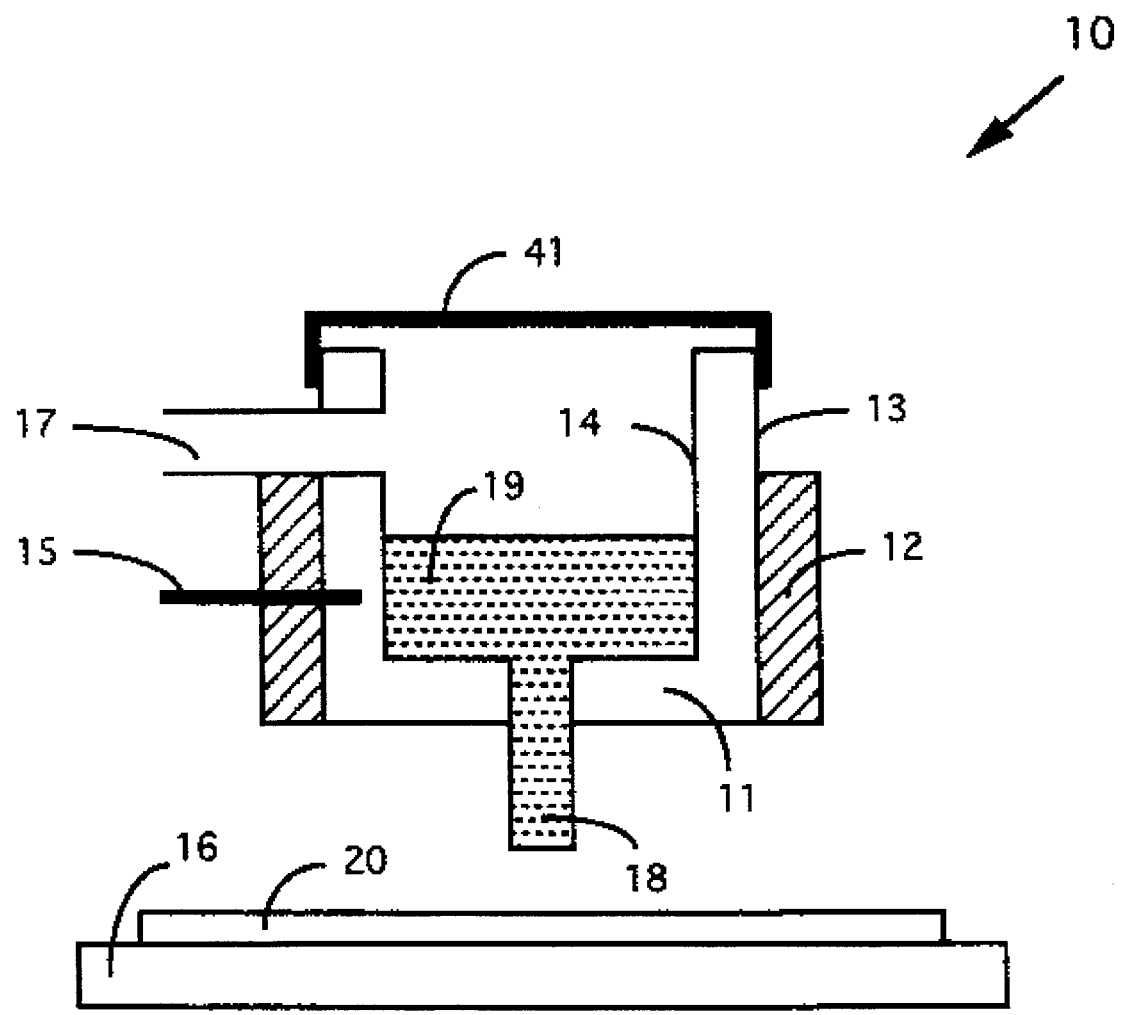
FIG. 7 shows a side cross-sectional view of a portion of a contact probe using conductive meltable material of the present invention.

Referring to FIG. 7 for a contact probe 10 of the present invention which includes a cylinder 11 constructed with an electrical conductive material such as aluminum with diameter ranging from three to twenty millimeters (mm). A metal reservoir 14 is formed inside the cylinder 11 which has a diameter ranging from two to ten millimeters in diameter. A capillary tube 18 of one to five millimeters in diameter is extended downwardly from the inside of the metal reservoir 14. The conductive cylinder 11 is surrounded by heating elements 12. An electrically insulation layer 13, which may be a ceramic layer, is placed between the heating elements 12 and the cylinder 11 for electrically insulating the cylinder 11 from the heating elements 12. The air pressure of the reservoir 14 is controllable by a pressure control means which includes an air duct 17 which is preferably a duct of one to five millimeters in diameter connected to a gas pump or vacuum pump (not shown). Pressurized gas such as nitrogen can be pumped into the reservoir 14 via the duct 17 for adjusting the pressure of the reservoir 14. A metal cap 41 seals the top of the cylinder 11 to form an air tight chamber for controlling the pressure inside the reservoir 14.

A low-melting point conductive-probing material 19, e.g., indium or gallium which has melting point of 158° C. and 30° C. respectively, is placed in the reservoir 14. By increasing the temperature and the pressure in the reservoir 14, using the heating elements 12 and the pressure control means, i.e., the duct 17, the low-melting point conductive-probing material 19 is melted and flow downwardly through the capillary tube 18 to be in contact with a wafer 20 placed on a conductive thermal chuck 16. The contact probe 10 further includes a test electrode 15 which is electrically connected to the cylinder 11. The test electrode 15 is therefore electrically connected to the metal reservoir 14 and the wafer through the low-melting point conductive-probing material 19 which is now in contact with the wafer 20. For performing the function of mobile ion measurements or system contamination monitoring, the temperature of the contact probe 10 is then lowered by deactivating the thermal element 12. The low-melting-point conductive-probing material 19 is solidified once the temperature is lowered below the melting point. The electrode 15 and the thermal chuck 16 can then be connected to a measurement device, e.g., a C-V or I-V measurement device, for measuring and monitoring the ion densities in the thin film on the top surface of the wafer 20. Other than the mobile ion measurement, the I-V measurement can also be used to measure the Schottky barrier height of the metal semiconductor contact and the C-V curve can be used to measure the epitaxial (EPI) or the substrate doping concentration. The relative position of the duct 17 and the electrode 15 can be flexibly arranged for the convenience of the probing and measurement functions to be conducted using this contact probe 10. The contact probe 10 may also include an electro-optical device or a mechanical device (not shown) as a distance sensor to measure and providing control signal to maintain a constant distance ranging from 0.1 to 1.0 millimeter between the lower end of the capillary tube 18 and the top surface of the wafer 20 such that mechanical damages to the wafer can be prevented.

In performing the contamination measurements or process monitoring operations, the contact area between the contact probe 10 and the wafer 20 is determined by the diameter of the capillary tube 18 and the pressure of the reservoir 14. To monitor mobile ion contamination using either TVS (or I-V) or C-V method, the wafer 20 is heated up to 100° to 300° C. by the thermal chuck. When the TVS method is applied, both the mobile ion contamination level and the element contents for different kinds of ions can be detected by referencing the I-V characteristics measured at elevated temperatures. When the C-V method is employed, temperature bias stress is to be applied to the wafer 20 after the set-up temperature is reached. Following the application of the temperature stress bias, the thermal chuck is then cooled down to room temperature using circulated water and the C-V measurements are then carried out. At the completion of all the monitoring or the required measurements, the low-melting-point probing material 19 can then be melted and drawn back to the reservoir 14 via the capillary tube 18 by a sucking force applied by a vacuum pump from the duct 17.

In summary the present invention discloses a contact probe 10 for contacting a test object 20 for performing measurements thereon by employing a measuring device connected to the probe 10. The contact probe 10 includes a storage and deploying means, i.e., the reservoir 14 enclosed inside the cylinder 11, for storing a low-melting-point probing material 19 therein. The contact probe 10 further includes a temperature control means, e.g., the heating elements 12, for controlling the temperature of the storage and deploying means 14. The storage and deploying means 14 further includes a probing-contact delivery means, e.g., the capillary tube 18, which being in hydraulic communication with the storage and deploying means 14. The probing-contact delivery means 18 is positioned near the test object 20 whereby the low-melting-point probing material 19 is melted and being delivered to contact the test object 20 through the probing-contact delivery means 18 when the temperature control means 12 raises the temperature of the storage and deploying means 14 above a melting point of the low-melting-point probing material 19. In a preferred embodiment, the storage and deploying means 14 further including a pressure control means, e.g., a duct 17 and the connected pumps (not shown), for controlling the pressure therein and for controlling delivery of the low-melting-point probing material 19 to the test object 20. In one of the preferred embodiments, the low-melting-point probing material 19 is an electrical conductive material whereby the contact probe 10 is suitable for performing electrical measurements on the test object 20. The low-melting-point probing material 19 can be either gallium or indium or can be any electrically conductive alloy having a melting point below 300° C. The test object 20 can be a semiconductor wafer and the probing-contact delivery means is an elongated capillary tube 18 extended to be near the semiconductor wafer 20 for delivering the conductive low-melting-point probing material 19 to contact the wafer 20 whereby the contact probe 10 can be applied for in-line process monitor at elevated temperature. In one of the preferred embodiments, the temperature control means 12 includes electrical heating elements disposed near the storage and deploying means 14.

Figure 8:
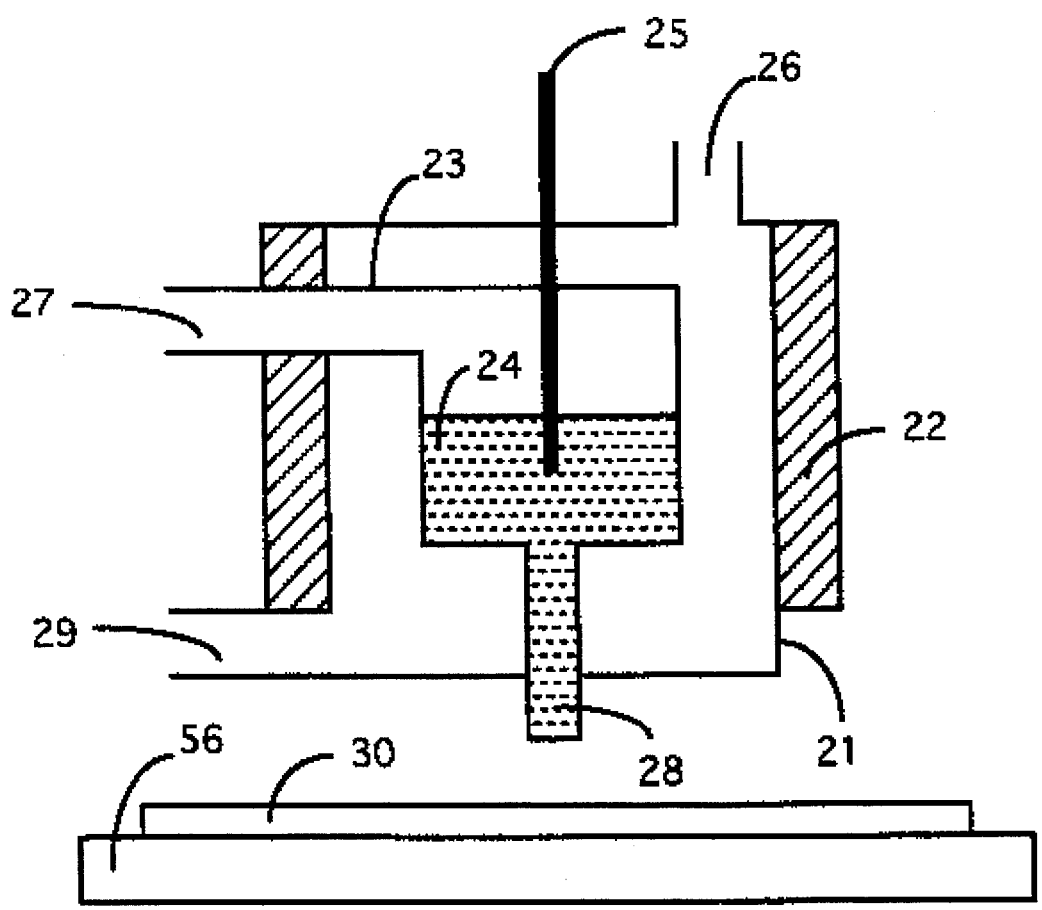
FIG. 8 shows a side cross-sectional view of another contact probe using conductive meltable material of the present invention.

FIG. 8 shows another preferred embodiment of the present invention which is specifically designed for a contact probe employing a contact-probing material with relatively higher temperature of melting point, e.g., indium has a melting point of 158° C. In order to reduce the necessary time for lowering the temperature to achieve higher measurement through-put, the temperature control system further includes a bath chamber 21 which is approximately five to twenty millimeters in diameter constructed by aluminum where the top and the bottom of the chamber 21 are connected with a gas line. One of these gas lines is used as an input gas line and another as output gas line. Cooling air, nitrogen, argon or helium can be used to flow through the chamber 21 to effectively lower the temperature of the contact probe such that the time for system cooling-off can be reduced. With the highest thermal conductivity among these cooling gases, helium can be a most effective cooling gas for the contact probe. An aluminum electrode 25 is in electrical contact with a contact-probing material 24 as shown in FIG. 8 or the electrode 25 can be connected with a metal reservoir 23 made of conductive metal or alloys. The heating element 22 is installed outside of the bath chamber 21. The reservoir 23 includes a capillary tube 28 for delivering the melted contact-probing material 24 to the test wafer 20 placed on a thermal chuck 56. The reservoir also has a pressure controlling duct 27 which is used to inject pressurized gas or applying a sucking force to control the delivery of the contact-probing material to the wafer 30 via the capillary tube 28. Other than the addition of the bath chamber 21 for the purpose of cooling the system, the sequences and principles of operation are the same as the contact probe shown in FIG. 7 described above.

Figure 9:
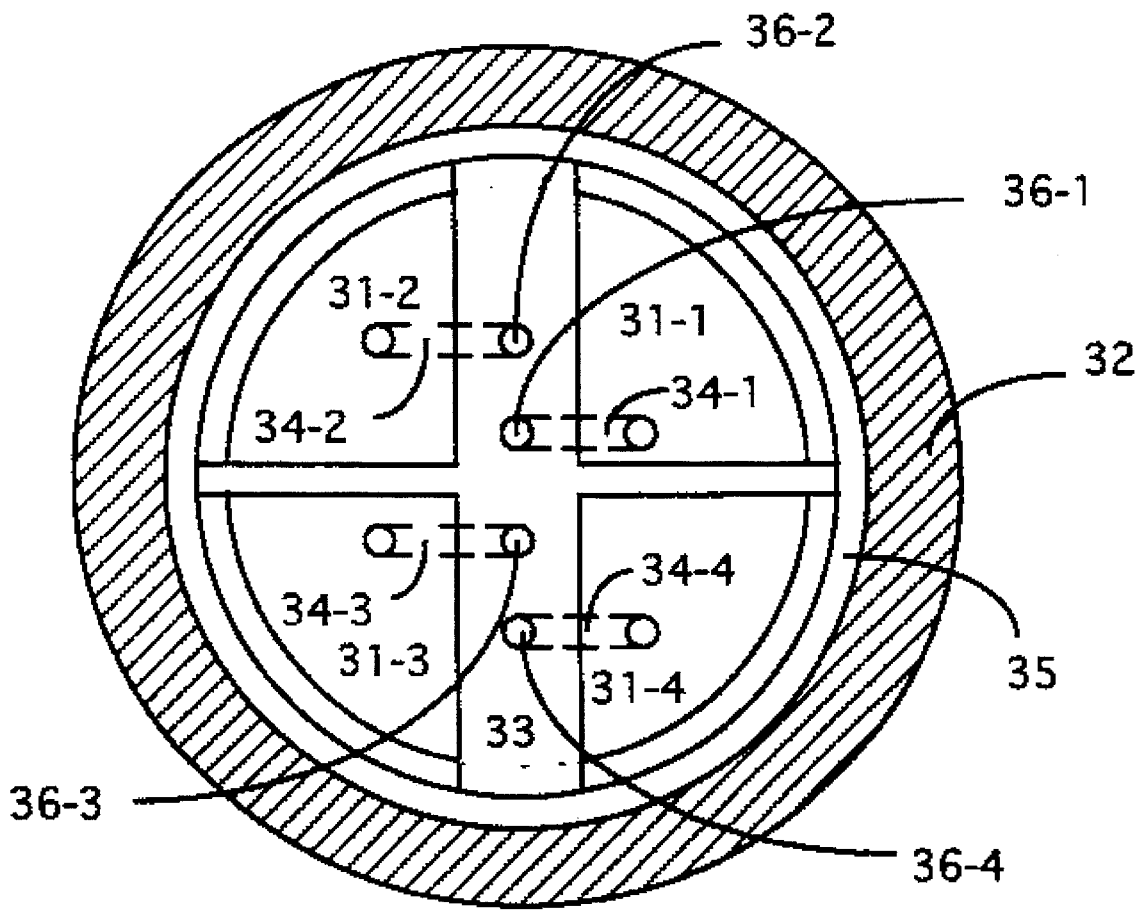
FIG. 9 shows a side cross-sectional view of a portion of a metal reservoir of a four point probe of the present invention.
Figure 10:
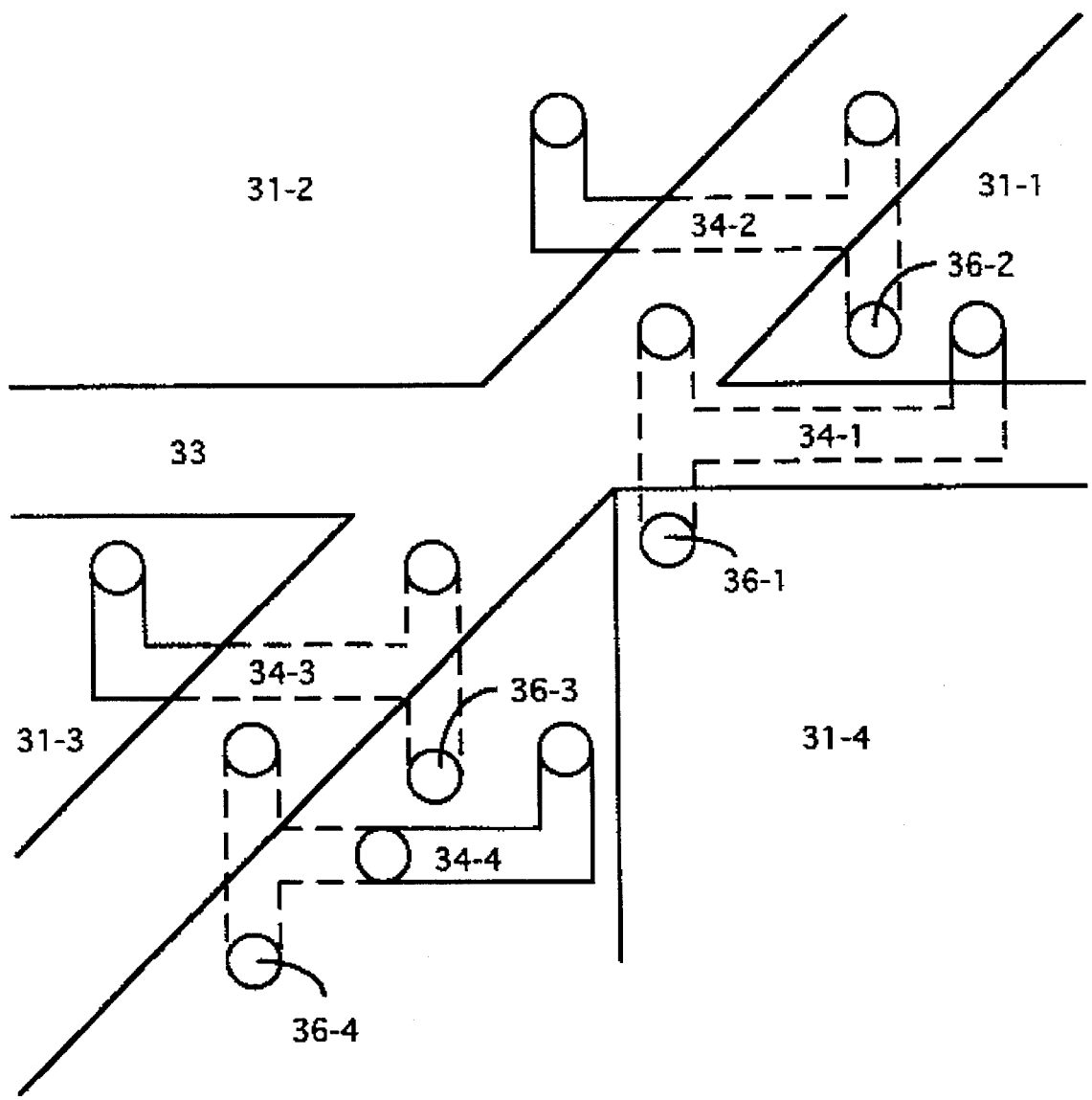
FIG. 10 shows a perspective view of a portion of a four-point contact probe using conductive meltable material of the present invention.

A four-point probe is shown in FIGS. 9 and 10. FIG. 9 shows a top view of a four-point probe which includes four separate reservoirs 31-1 to 31-4 separated by insulating partitions 33 composed of insulating materials such as ceramic. These four reservoirs 31-1 to 31-4 are surrounded by an electrically insulating layer 35 from an outer layer of heating element 32 for controlling the temperature of the reservoirs 31-1 to 31-4. Each of the reservoirs 31-1 to 31-4 are in hydraulic communication with a capillary tube 34-1 to 34-4 respectively for delivering the melted low-melting-point contact-probing material stored in the reservoirs 31-1 to 31-4 to the contact probes 36-1 to 36-4 when the temperature is raised by providing power to the heating element 32. The distance between the four-point probes 36-1 to 36-4 is typically 400–1200 microns (μm).

Therefore, by employing the low-melting-point conductive material as the contact-probing material for in-line process monitoring, the present invention teaches a mobile ion measurement technique implemented with a new and improved measurement device which enable those of ordinary skill to overcome the limitations encountered in the prior art. Specifically, the new and improved measurement technique can be performed without requiring the formation of aluminum dots on the wafers. High temperature direct ion measurements can be performed safely without causing any safety concerns. Furthermore, the present invention discloses a measurement technique implemented with new and improved measurement devices where the mobile ions can be directly and accurately measured without requiring the prob-pin. The concerns of wafer-surface damages caused by probe-pin slips, particularly, for shallow junction devices, are therefore eliminated.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A contact probe for contacting a test object for performing measurements thereon by employing a measuring device connected to the probe, said contact probe comprising:

a storage and deploying means for storing a low-melting-point probing material therein;

a temperature control means for controlling the temperature of said storage and deploying means;

said storage and deploying means further including a probing-contact delivery means which being in hydraulic communication with said storage and deploying means, said probing-contact delivery means being positioned near said test object;

wherein said temperature control means control a temperature above and below a melting point of said low-melting probing material whereby said low-melting-point probing material being melted and delivered to contact said test object through said probing-contact delivery means when said temperature control means raising the temperature of said storage and deploying means above said melting point of said low-melting-point probing material, and said low melting point probing material being solidified for performing said measurement when said temperature control means lowering the temperature below said melting point.

2. The contact probe of claim 1 wherein:

said storage and deploying means further including a pressure control means for controlling the pressure therein and, with said temperature control means controlling a temperature above said melting point of said low-melting probing material, for controlling delivery of said low-melting-point probing material to said test object, said pressure control means further a sucking force, for drawing said low-melting point probing material back to said storage and deploying means through said probing-contact delivery means.

3. The contact probe of claim 2 wherein:

said low-melting-point probing material being an electrically conductive material whereby said contact probe is suitable for performing electrical measurements on said test object.

4. The contact probe of claim 3, wherein:

said low-melting-point probing material is gallium.

5. The contract probe of claim 3 wherein:

said low-melting-point probing material is indium.

6. The contact probe of claim 3 wherein:

said low-melting-point probing material is an electrically conductive alloy having a melting point below 300° C.; and said temperature control means further includes a cooling means to facilitate lowering of the temperature of said storage and deploying means to cool the low-melting point probing material.

7. The contact probe of claim 3 wherein:

said test object being a semiconductor wafer and said probing-contact delivery means being an elongated capillary tube extended to be near said semiconductor wafer for delivering said conductive low-melting-point probing material to contact said wafer whereby said contact probe can be applied for in-line process monitor at elevated temperature.

8. The contact probe of claim 1 wherein:

said temperature control means includes electrical heating elements disposed near said storage and deploying means.

9. The contact probe of claim 1 wherein:

said temperature control means includes gas heating elements disposed near said storage and deploying means.

10. The contact probe of claim 1 wherein:

said storage and deploying means further including a plurality of probing-contact delivery means wherein each being in hydraulic communication with said storage and deploying means, each of said probing-contact delivery means being positioned near said test object; and wherein said temperature control means control a temperature above and below a melting point of said low-melting probing material whereby said low-melting-point probing material being melted and delivered to contact said test object through said plurality of probing-contact delivery means when said temperature control means raising the temperature of said storage and deploying means above a melting point of said low-melting-point probing material, and said low melting-point probing material being solidified for performing said measurements when said temperature control means lowering the temperature below safe melting point.

11. A contact probe for contacting a test object, which being a semiconductor wafer, for performing measurements thereon by employing a measuring device connected to the probe, said contact probe comprising:

a storage and deploying means for storing a low-melting-point probing material therein, said low-melting-point probing material being an electrically conductive material whereby said contact probe is suitable for performing electrical measurements on said test object;

a temperature control means including electrical heating elements disposed near said storage and deploying means for controlling the temperature therein;

said storage and deploying means further including a probing-contact delivery means which being in hydraulic communication with said storage and deploying means, said probing-contact delivery means being positioned near said test object;

wherein said temperature control means control a temperature above and below a melting point of said low-melting probing material whereby said low-melting-point probing material being melted and delivered to contact said test object through said probing-contact delivery means when said temperature control means raising the temperature of said storage and deploying means above said melting point of said low-melting-point probing material, and said low melting-point probing material being solidified for performing said measurement when said temperature control means lowering the temperature below said melting point; and said storage and deploying means further including a pressure control means for controlling the pressure therein and for controlling delivery of said low-melting-point probing material to said test object, said pressure control means further can apply a sucking force, with said temperature control means controlling a temperature above said melting point of said low-melting probing material, for drawing said low-melting-point probing material back to said storage and deploying means through said probing-contact delivery means.

12. A method for performing measurements by applying a contact probe to contact a test object while employing a measuring device connected to said contact probe, said measurement method comprising the steps of:

(a) employing a storage and deploying means for storing a low-melting-point probing material therein;

(b) positioning a probing-contact delivery means which being in hydraulic communication with said storage and deploying means for extending therefrom to be near said test object; and (c) raising the temperature of said storage and deploying means above a melting point of said low-melting-point probing material whereby said low-melting-point probing material being melted and delivered to contact said test object through said probing-contact delivery means; and (d) lowering the temperature of said storage and deploying means below said melting point of said low-melting-point probing material whereby said low-melting point probing material being solidified for performing said measurements.

13. The measurement method as recited in claim 12 wherein:

said step (b) of positioning a probing-contact delivery means near said test object being a step of positioning said probe-contact delivery means near a semiconductor wafer; and said step (c) of raising the temperature of said storage and deploying means for melting and delivering said low-melting-point probing material being a step of melting and delivering a conductive low-melting-point metallic material to contact said semiconductor wafer whereby said contact probe can be applied for in-line process monitor at elevated temperature.

14. The measurements method as recited in claim 12 further comprises a step of:

(d) controlling the pressure in said storage and deploying means by employing a pressure control means for controlling delivery of said low-melting-point probing material to said test object.

* * * * *